United States Patent
Haggerty et al.

(10) Patent No.: US 10,621,303 B2
(45) Date of Patent: Apr. 14, 2020

(54) CLOSED LOOP CONTROL AND BUILT-IN TEST UTILIZING REDUCED ORDER MODEL

(71) Applicant: Hamilton Sundstrand Corporation, Windsor Locks, CT (US)

(72) Inventors: Nathan Haggerty, Avon, CT (US); Tony Ho, Glastonbury, CT (US)

(73) Assignee: Hamilton Sundstrand Corporation, Windsor Lock, CT (US)

(*) Notice: Subject to any disclaimer, the term of this patent is extended or adjusted under 35 U.S.C. 154(b) by 1017 days.

(21) Appl. No.: 15/095,357

(22) Filed: Apr. 11, 2016

(65) Prior Publication Data
US 2017/0293710 A1 Oct. 12, 2017

(51) Int. Cl.
- *G06F 17/50* (2006.01)
- *G05B 17/02* (2006.01)
- *G05B 15/02* (2006.01)

(52) U.S. Cl.
CPC ......... *G06F 17/5086* (2013.01); *G05B 15/02* (2013.01); *G05B 17/02* (2013.01)

(58) Field of Classification Search
CPC ...... G06F 17/5086; G05B 15/02; G05B 17/02
USPC .......................................................... 703/2
See application file for complete search history.

(56) References Cited

U.S. PATENT DOCUMENTS

| | | | |
|---|---|---|---|
| 7,261,762 B2* | 8/2007 | Kang | B01D 46/0086 116/DIG. 25 |
| 7,905,098 B2 | 3/2011 | Pham | |
| 8,478,568 B2 | 7/2013 | Desabhatla et al. | |
| 8,726,678 B2 | 5/2014 | Tumey et al. | |
| 9,116,520 B2 | 8/2015 | Goupil et al. | |
| 2007/0240435 A1 | 10/2007 | Elpem et al. | |
| 2009/0306943 A1 | 12/2009 | Abdel-Khalik et al. | |
| 2015/0169811 A1* | 6/2015 | Turnquist | G06F 17/5018 703/2 |
| 2015/0355615 A1 | 12/2015 | Lee | |
| 2016/0069767 A1* | 3/2016 | Ishiba | G06F 3/0414 702/98 |
| 2016/0160866 A1* | 6/2016 | Zywiak | F04D 27/004 415/1 |

OTHER PUBLICATIONS

Extended European Search report for EP Application No. 17161638.6, dated Sep. 28, 2017, 12 pages.

* cited by examiner

Primary Examiner — Kamini S Shah
Assistant Examiner — Faraj Ayoub
(74) *Attorney, Agent, or Firm* — Kinney & Lange, P.A.

(57) ABSTRACT

A system includes a plurality of sensors, a controller and a component. The plurality of sensors are configured to obtain sensed data indicative of characteristics of an environment. The controller is configured with a reduced order model to output a predicted parameter based on the sensed data. The reduced order model is generated on an external computer system using a high-fidelity physics-based model. The controller is configured to control the component based on the predicted parameter.

11 Claims, 4 Drawing Sheets

CLOSED LOOP CONTROL AND BUILT-IN TEST UTILIZING REDUCED ORDER MODEL

BACKGROUND

The present invention relates generally to parameter prediction and in particular to closed loop control and built-in test (BIT) of components using a reduced order model (ROM).

Complex systems, such as those implemented onboard aircraft, often include parameters that may not be sensed by physical sensors of the system. For example, air-conditioning packs may not have sensor readings for parameters such as Air Cycle Machine (ACM) rotational speed. It may be possible to sense these parameters with physical sensors, but at added cost and complexity. Other parameters, such as compressor or fan surge margin, may not be measurable by physical sensors at all. Even though these parameters are not sensed, knowledge of the parameters may be useful for protective or backup control modes. Adding additional sensors, however, contributes to higher cost and complexity, as well as reoccurring cost to the product. It is desirable to implement a low-cost method of determining characteristics of an environment not directly sensed by physical sensors.

SUMMARY

A method of controlling a system includes generating, using a computer system, a reduced order model, wherein the reduced order model is configured to generate a parameter output based on sensor input; loading the reduced order model into a controller of the system; providing, from a plurality of sensors, sensor data to the reduced order model; generating, by the reduced order model, an active parameter output based on the sensor data; and controlling, using the controller, a component of the system based on the active parameter output.

A method of performing a test of a component of a system includes generating, using a computer system, a reduced order model, wherein the reduced order model is configured to generate a parameter output based on sensor input; loading the reduced order model into a controller of the system; initiating, using the controller, a test of the component of the system; providing, from a plurality of sensors, sensor data to the reduced order model during the test of the component; generating, by the reduced order model, an active parameter output based on the sensor data; and verifying, by the controller, correct operation of the component based on the active parameter output.

A system includes a plurality of sensors, a controller and a component. The plurality of sensors are configured to obtain sensed data indicative of characteristics of an environment. The controller is configured with a reduced order model to output a predicted parameter based on the sensed data. The reduced order model is generated on an external computer system using a high-fidelity physics-based model. The controller is configured to control the component based on the predicted parameter.

DETAILED DESCRIPTION

A sensor system is disclosed herein that utilizes a reduced order model (ROM) to generate predicted parameters for use in closed loop control and built-in test (BIT). The sensor system includes a plurality of sensors, a controller, and a system component, such as an air cycle machine, for example. The sensors are configured to sense data indicative of characteristics of the environment such as system pressures, system temperatures, valve positions, control references, or characteristics related to the ambient environment or system operation. The controller inputs the sensed data into the ROM to generate a predicted parameter. The controller monitors the predicted parameter to control the component and/or test the component.

Figure 1:
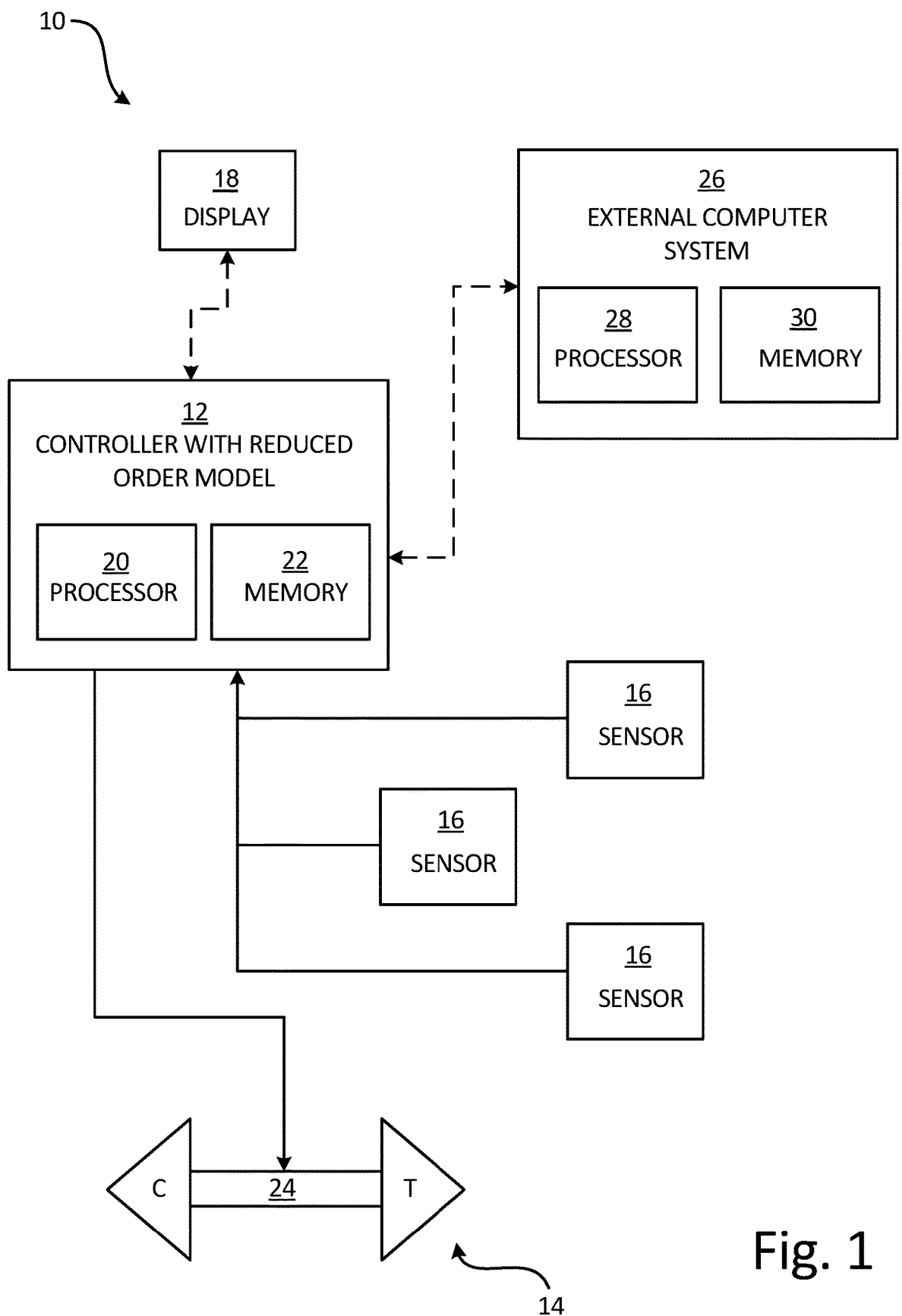
FIG. 1 is a block diagram illustrating a reduced order model (ROM) sensor system utilized to perform built-in test (BIT) and closed loop control for an aircraft system.

FIG. 1 is a block diagram illustrating reduced order model (ROM) sensor system 10 utilized to perform built-in test (BIT) and closed loop control for air cycle machine (ACM) 14. System 10 includes controller 12, ACM 14, sensors 16 and display 18. Controller 12 includes processor 20 and memory 22. ACM 14 includes at least one shaft 24. ACM 14 may also include a fan (not shown), compressor (C) and turbine (T) connected to shaft 24. While illustrated as an ACM of an aircraft air conditioning pack in FIG. 1, ACM 14 may be any component controllable by controller 12 that includes properties not directly sensed by sensors 16. An aircraft air conditioning pack may also include many other components not shown in FIG. 1, such as heat exchangers, valves, ducts and other components. Controller 12 may be configured to directly control ACM 14, or may indirectly control ACM 14 through the control of valves, for example. Controller 12 may be physically located in close proximity to, or apart from, ACM 14. Display 18 may be located in the cockpit of the aircraft, for example, to provide visual data from controller 12 to a pilot. While illustrated and described as an air cycle system, system 10 may be any system that includes components for which it is desirable to measure values not directly sensed by physical sensors such as, for example, vapor cycle systems and/or other systems onboard an aircraft.

Sensors 16 are any sensors within system 10 capable of providing sensed data to controller 12 regarding characteristics of the environment. For example, sensors 16 may include analog and/or digital sensors that provide analog and/or digital data to controller 12 over wired and/or wireless connections. For example, if system 10 is an aircraft system, sensors 16 may be any sensors located on the aircraft including, but not limited to, sensors that provide system pressures, system temperatures, valve positions, control references, or characteristics related to the ambient environment or aircraft operation.

Apart from system 10, controller 12 may be connectable to receive data from external computer system 26 using any form of wired or wireless data transfer. External computer system 26 includes processor 28 and memory 30. Memory 30 may be loaded with a high-fidelity physics-based model representative of system 10. The physics-based model may be utilized by computer system 26 to generate parameters regarding system 10 such as a rotational speed of shaft 24 of ACM 14. These parameters may be based on various inputs regarding the environment in which ACM 14 is located. For example, the inputs to the physics-based model may represent data obtainable by sensors 16 of system 10. These inputs may include, for example, system pressures, system temperatures, valve positions, control references, or characteristics related to the ambient environment or operation of the aircraft.

External computer system 26 may be configured to generate a reduced order model (ROM) based upon the high-fidelity physics-based model. For example, for any desired parameter of system 10, the high-fidelity physic-based model may be utilized to generate several data points over the operating envelope of ACM 14. The rotational speed of shaft 24, for example, may be calculated by the physics-based model over an entire flight envelope for an aircraft that includes system 10 using inputs representative of data from sensors 16. Curve fitting may then be used, for example, on the ACM shaft speed data points generated by the physics-based model over the flight envelope. The curve fit may be utilized to generate a ROM. The ROM may be implemented, for example, using the following equation:

$$y = b_0 + \Sigma_i b_i x_i^{c_i} + \Sigma_j b_j (X)_j^{c_j} \qquad [1]$$

Where:
y is the predicted parameter,
$b_0$ is a constant,
$b_i$ and $b_j$ are multiplicative regression coefficients,
$c_i$ and $c_j$ are exponential regression coefficients,
$x_i$ are first order parameters, and
$X_j$ are interaction terms (the product of any two first order parameters).

Values from sensors 16 may be provided to controller 12 and input into equation [1] to generate the predicted parameter during operation of system 10, for example. In an embodiment, the values from sensor 16 provided to controller 12 may include, among others, primary heat exchanger output temperature, compressor outlet temperature, first stage turbine outlet temperature and air conditioning pack inlet temperature. Sensors 16 may include tolerances such that sensed data is expected to be within a known error range. To account for theses variations in sensor data, random perturbations in the represented sensor values may be included when generating data points for the predicted parameter using the physics-based model. For example, sensors 16 may include +/−5% error for the accuracy of data they provide to controller 12. To account for this, random perturbations of +/−5% or more may be introduced into the inputs of the high-fidelity physics-based model when generating the predicted parameter over the flight envelope.

Figure 2A:
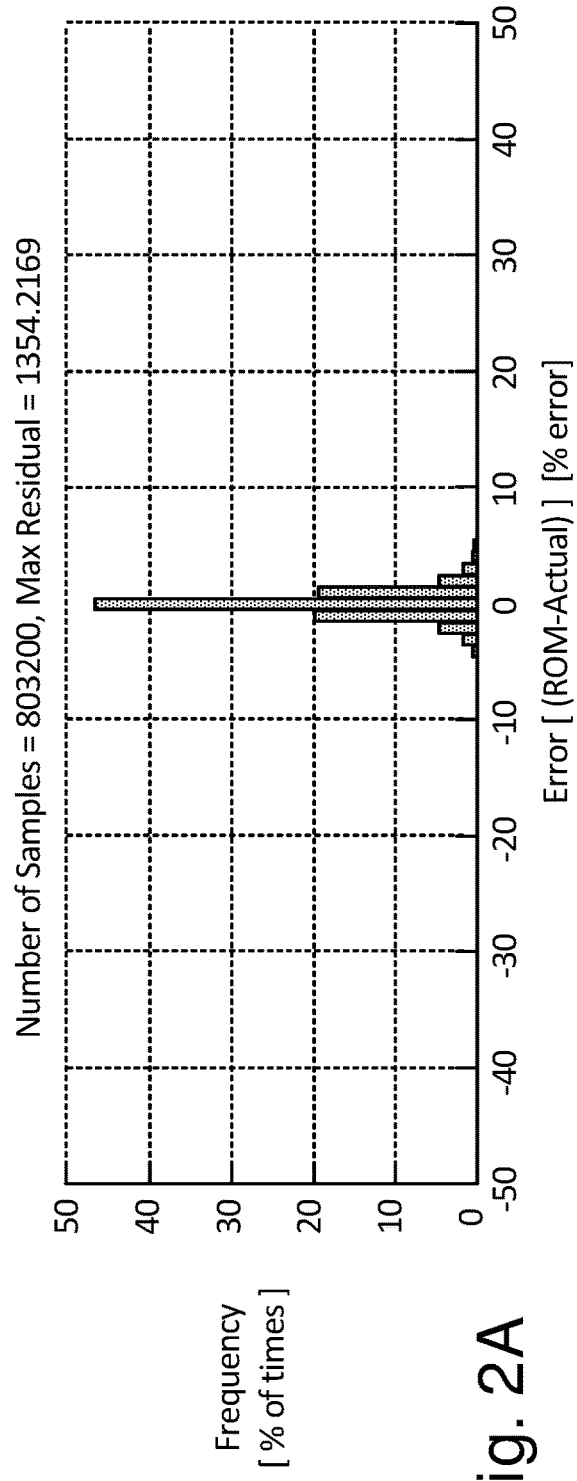
FIGS. 2A and 2B are a bar graph and a scatter plot, respectively, illustrating a comparison between a reduced order model (ROM) predicted air cycle machine (ACM) speed to a detailed high-fidelity model ACM speed.
Figure 2B:
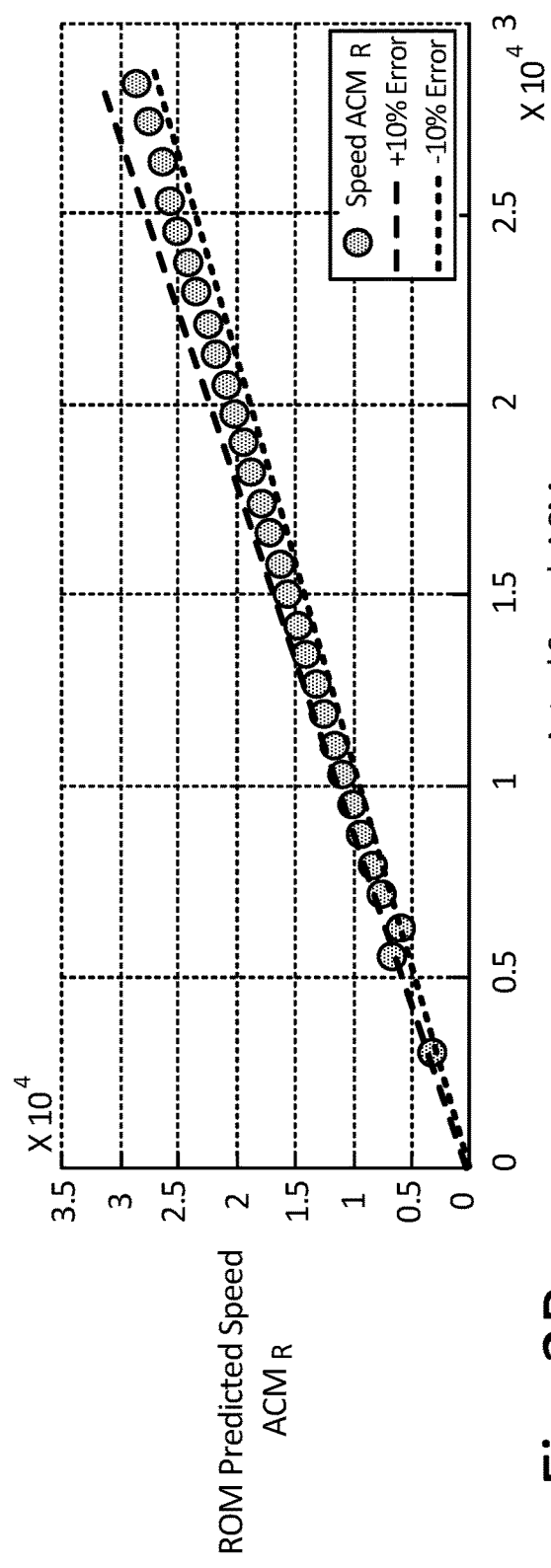

FIGS. 2A and 2B are a bar graph and a scatter plot, respectively, illustrating a comparison between a reduced order model (ROM) predicted air cycle machine (ACM) shaft speed to a detailed high-fidelity model ACM shaft speed. The bar graph and scatter plot compare the generated parameters of the ROM using, for example, commercially available sensors implemented onboard an aircraft, with the generated parameters of the high-fidelity physics-based model. The results of the bar graph and scatter plot show that even when sensor uncertainties are introduced, the ROM is robust enough to generate reliable predictions with sufficient accuracy (e.g., within +/−10% error) for ACM speed for a wide range of the system operating envelope.

Figure 3:
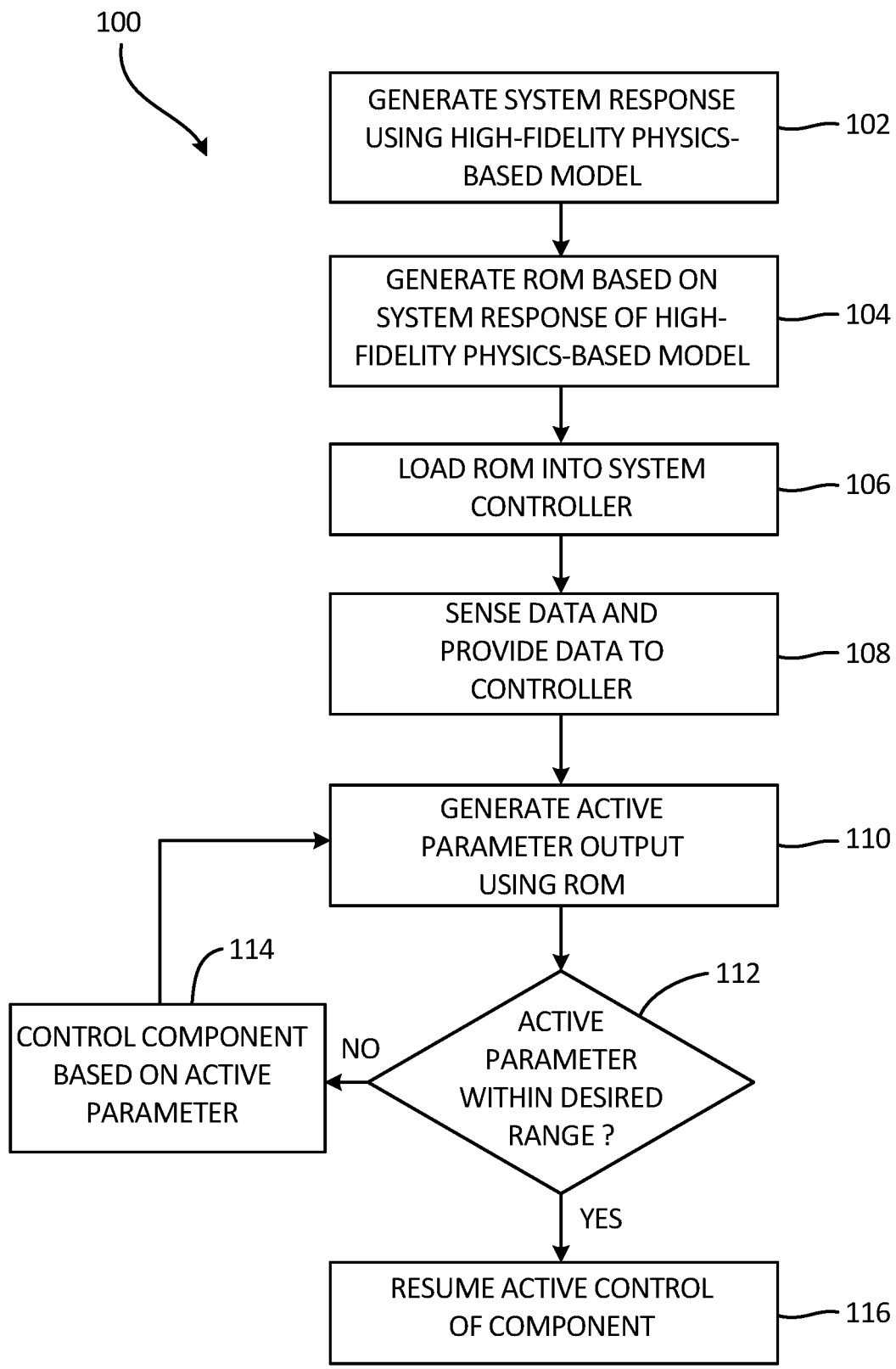
FIG. 3 is a flowchart illustrating a method of performing closed loop control using a reduced order model (ROM).

With continued reference to FIG. 1, FIG. 3 is a flowchart illustrating method 100 of performing closed loop control of system 10 using a reduced order model (ROM). At step 102, external computer system 26 is utilized to generate values of a predicted parameter for all operating conditions of system 10. Computer system 26 may utilize a high-fidelity physics-based model that is representative of system 10. Inputs to the physics-based model may be representative of sensor data obtainable by sensors 16 of system 10. For example, if system 10 is an aircraft, inputs to the physics-based model may be used to generate the predicted parameter over the entire flight envelope. The inputs may also be randomly adjusted to represent expected errors in accuracy of the sensors for which the inputs are representative.

At step 104, the output of the physics-based model is utilized to generate the ROM. For example, curve fitting may be used on the generated values of the predicted parameter. Using the curve fit, the ROM may be generated in the form of equation [1]. At step 106, the ROM is loaded into controller 12 of system 10. This may be accomplished using any type of wired and/or wireless digital data transfer from computer system 26.

At step 108, system 10 is in operation and sensors 16 are sensing data and providing the sensed data to controller 12. At step 110, the ROM generates an active parameter output based upon the provided sensed data. For example, the active parameter output may be a rotational speed of shaft 24 of ACM 14. In other embodiments, the active parameter output may be any characteristic of system 10 which is not readily obtainable from the sensed data. At step 112, controller 12 monitors the active parameter to ensure ACM 14 is operating within a desired range. For example, ACM 14 may include air bearings that require a minimum air flow and thus a minimum rotational speed of shaft 24 and hardware limitations for the purposes of containment of compressor blades of ACM 14 may impose a maximum rotational speed of shaft 24. Controller 12 may monitor the active parameter output to determine if the speed of shaft 24 of ACM 14 is within this range. If the active parameter is outside of the desired range, for example, method 100 proceeds to step 114. If the active parameter is within the desired range, method 100 proceeds to step 116 and resumes active operation of system 10.

At step 114, controller 12 controls ACM 14 to bring the speed of shaft 24 into a desired range. For example, controller 12 may control valves of system 10 to control flow to ACM 14 in order to increase or decrease the speed of shaft 24. At step 118, controller 12 monitors the active parameter to determine if the speed of shaft 24 has moved within the desired speed range. If the speed is now within range, method 100 moves to step 116 and resumes active control. If the speed is not yet within range, method 100 returns to step 114 and controller 12 continues to control ACM 14 to bring the speed within the desired range.

Figure 4:
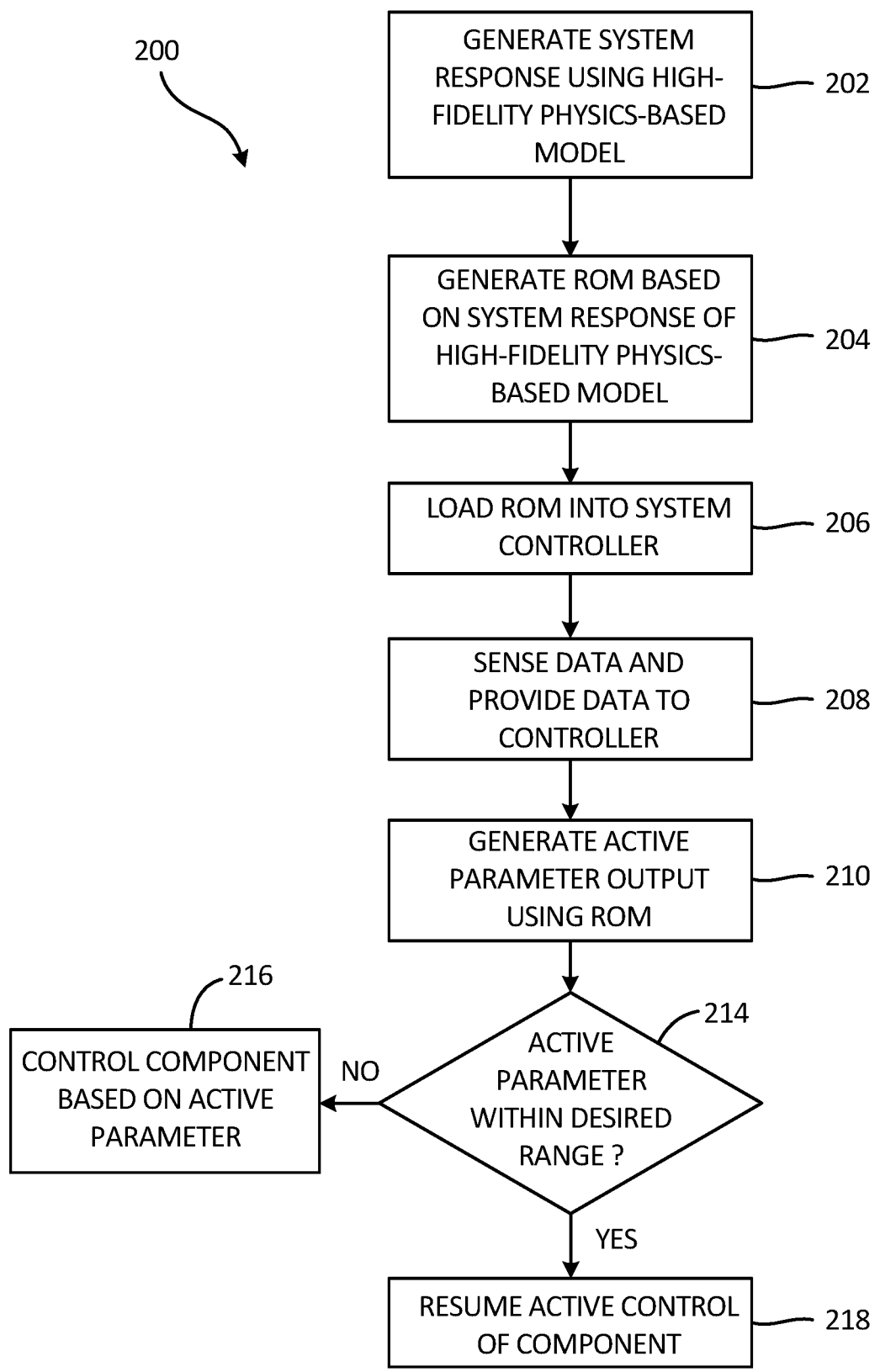
FIG. 4 is a flowchart illustrating a method of performing built-in test (BIT) using a reduced order model (ROM).

With continued reference to FIG. 1, FIG. 4 is a flowchart illustrating method 200 of performing built-in test (BIT) for system 10 using a reduced order model (ROM). Steps 202-206 are substantially similar to steps 102-106 of method 100 illustrated in FIG. 3. At step 208, a built-in-test (BIT) is initiated by controller 12. For example, this may be a test of ACM 14 while an aircraft that includes ACM 14 is on the ground. Controller 12 may operate system 10 to start up and run ACM 14 under desired test conditions. At step 210, sensors 16 are sensing data and providing the sensed data to controller 12. At step 212, the ROM generates an active parameter output based upon the provided sensed data. For example, the active parameter output may be a rotational speed of shaft 24 of ACM 14. In other embodiments, the active parameter output may be any characteristic of system 10 which is not readily obtainable from the sensed data and for which it is desirable to perform built-in testing. At step 214, controller 12 monitors the active parameter to determine if the parameter is in a desired range for the current test. If the parameter is in the expected range for the test, method 200 proceeds to step 216 and a successful test is indicated to display 18, for example. If the parameter is outside the expected range for the test, method 200 proceeds to step 218 and a failed test is indicated to display 18, for example.

By utilizing a ROM to perform closed loop control and built-in test of components of a system, more robust control and testing of systems may be performed without the added cost and complexity of adding additional sensors to the system. Additionally, the generated parameters may be utilized for other tasks involving components other than the component for which the parameter is being generated. For example, knowledge of ACM speed may be utilized to schedule or close loop control ram doors of a ram air fan (RAF) to prevent RAF surge.

Discussion of Possible Embodiments

The following are non-exclusive descriptions of possible embodiments of the present invention.

A method of controlling a system includes generating, using a computer system, a reduced order model, wherein the reduced order model is configured to generate a parameter output based on sensor input; loading the reduced order model into a controller of the system; providing, from a plurality of sensors, sensor data to the reduced order model; generating, by the reduced order model, an active parameter output based on the sensor data; and controlling, using the controller, a component of the system based on the active parameter output.

The method of the preceding paragraph can optionally include, additionally and/or alternatively, any one or more of the following features, configurations, operations, and/or additional components:

A further embodiment of the foregoing method, wherein generating, using the computer system, the reduced order model includes generating, using the computer system, the reduced order model using a high-fidelity physics-based model.

A further embodiment of any of the foregoing methods, wherein generating, using the computer system, the reduced order model further includes adjusting, using the computer system, the simulated sensor inputs based upon tolerances of the plurality of sensors.

A further embodiment of any of the foregoing methods, wherein the system is an aircraft system, the component is an air cycle machine, and the active parameter output is a predicted speed of the air cycle machine.

A further embodiment of any of the foregoing methods, wherein controlling, using the controller, the component of the system based on the active parameter output includes controlling, using the controller, the air cycle machine to control a physical speed of a shaft of the air cycle machine; and verifying, using the controller, the physical speed of the air cycle machine based on the active parameter output.

A further embodiment of any of the foregoing methods, wherein the reduced order model is in the form: $y=b_0+\Sigma_i b_i x_i^{c_i}+\Sigma_j b_j(X)_j^{c_j}$; where: y is the active parameter output; $b_0$ is a constant; $b_i$ and $b_j$ are multiplicative regression coefficients; $c_i$ and $c_j$ are exponential regression coefficients; $x_i$ are first order parameters; and $X_j$ are interaction terms.

A method of performing a test of a component of a system includes generating, using a computer system, a reduced order model, wherein the reduced order model is configured to generate a parameter output based on sensor input; loading the reduced order model into a controller of the system; initiating, using the controller, a test of the component of the system; providing, from a plurality of sensors, sensor data to the reduced order model during the test of the component; generating, by the reduced order model, an active parameter output based on the sensor data; and verifying, by the controller, correct operation of the component based on the active parameter output.

The method of the preceding paragraph can optionally include, additionally and/or alternatively, any one or more of the following features, configurations, operations, and/or additional components:

A further embodiment of the foregoing method, wherein generating, using the computer system, the reduced order model includes generating, using the computer system, the reduced order model using a high-fidelity physics-based model.

A further embodiment of any of the foregoing methods, wherein generating, using the computer system, the reduced order model further includes adjusting, using the computer system, the simulated sensor inputs based upon tolerances of the plurality of sensors.

A further embodiment of any of the foregoing methods, wherein the system is an aircraft system, the component is an air cycle machine, and the active parameter output is a predicted speed of the air cycle machine.

A further embodiment of any of the foregoing methods, verifying, by the controller, correct operation of the component based on the active parameter output includes monitoring, using the controller, the predicted speed of the air cycle machine; and indicating, using the controller, a successful test if the speed of the air cycle machine is within a threshold range; and indicating, using the controller, a failed test if the speed of the air cycle machine is outside of the threshold range.

A further embodiment of any of the foregoing methods, wherein the reduced order model is in the form: $y=b_0+\Sigma_i b_i x_i^{c_i}+\Sigma_j b_j(X)_j^{c_j}$; where: y is the active parameter output; $b_0$ is a constant; $b_i$ and $b_j$ are multiplicative regression coefficients; $c_i$ and $c_j$ are exponential regression coefficients; $x_i$ are first order parameters; and $X_j$ are interaction terms.

A system includes a plurality of sensors, a controller and a component. The plurality of sensors are configured to obtain sensed data indicative of characteristics of an environment. The controller is configured with a reduced order model to output a predicted parameter based on the sensed data. The reduced order model is generated on an external computer system using a high-fidelity physics-based model. The controller is configured to control the component based on the predicted parameter.

The system of the preceding paragraph can optionally include, additionally and/or alternatively, any one or more of the following features, configurations, operations, and/or additional components:

A further embodiment of the foregoing system, wherein the controller is further configured to perform a test of the component, and wherein the controller indicates a successful test if the predicted parameter is within a threshold range during the test of the component.

A further embodiment of any of the foregoing systems, wherein the predicted parameter is a characteristic of the system that cannot be directly sensed by the plurality of sensors.

A further embodiment of any of the foregoing systems, wherein the system is an aircraft air conditioning system, and wherein the component is an air cycle machine.

A further embodiment of any of the foregoing systems, wherein the predicted parameter is a rotational speed of a shaft of the air cycle machine.

A further embodiment of any of the foregoing systems, wherein the reduced order model is in the form: $y = b_0 + \Sigma_i b_i x_i^{c_i} + \Sigma_j b_j (X)_j^{c_j}$; where: y is the active parameter output; $b_0$ is a constant; $b_i$ and $b_j$ are multiplicative regression coefficients; $c_i$ and $c_j$ are exponential regression coefficients; $x_i$ are first order parameters; and $X_j$ are interaction terms.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of controlling an aircraft system, the method comprising:
    generating, using a computer system, values of a predicted parameter over an entire flight envelope of an aircraft using a high-fidelity physics-based model of the aircraft system based on simulated sensor input data, wherein the simulated sensor input data is representative of data that can be obtained from a plurality of sensors and is randomly adjusted to represent errors in accuracy of the plurality of sensors;
    generating, using the computer system, a reduced order model using the values of the predicted parameter over the entire flight envelope of the aircraft generated using the high-fidelity physics-based model;
    loading the reduced order model into a controller of the aircraft system;
    providing, from the plurality of sensors, sensor data to the reduced order model;
    generating, by the reduced order model, an active parameter output based on the sensor data; and
    controlling, using the controller, a component of the aircraft system based on the active parameter output.

2. The method of claim 1, wherein the component is an air cycle machine, and the active parameter output is a predicted speed of the air cycle machine.

3. The method of claim 2, wherein controlling, using the controller, the component of the aircraft system based on the active parameter output comprises:
    controlling, using the controller, the air cycle machine to control a physical speed of a shaft of the air cycle machine; and
    verifying, using the controller, the physical speed of the air cycle machine based on the active parameter output.

4. A method of performing a test of a component of an aircraft-system, the method comprising:
    generating, using a computer system, values of a predicted parameter over an entire flight envelope of an aircraft using a high-fidelity physics-based model of the aircraft system based on simulated sensor input data, wherein the simulated sensor input data is representative of data that can be obtained from a plurality of sensors and is randomly adjusted to represent errors in accuracy of the plurality of sensors;
    generating, using a computer system, a reduced order model using the values of the predicted parameter over the entire flight envelope of the aircraft using the high-fidelity physics-based model;
    loading the reduced order model into a controller of the aircraft system;
    initiating, using the controller, a test of the component of the aircraft system;
    providing, from the plurality of sensors, sensor data to the reduced order model during the test of the component;
    generating, by the reduced order model, an active parameter output based on the sensor data; and
    verifying, by the controller, correct operation of the component based on the active parameter output.

5. The method of claim 4, wherein the component is an air cycle machine, and the active parameter output is a predicted speed of the air cycle machine.

6. The method of claim 5, verifying, by the controller, correct operation of the component based on the active parameter output comprises:
    monitoring, using the controller, the predicted speed of the air cycle machine; and
    indicating, using the controller, a successful test if the predicted speed of the air cycle machine is within a threshold range; and
    indicating, using the controller, a failed test if the predicted speed of the air cycle machine is outside of the threshold range.

7. An aircraft system comprising:
    a plurality of sensors configured to obtain sensed data indicative of characteristics of an environment;
    a controller configured with a reduced order model to output an active parameter based on the sensed data, wherein the reduced order model is generated on an external computer system configured to generate values of a predicted parameter over an entire flight envelope of an aircraft using a high-fidelity physics-based model of the aircraft system based on simulated sensor input, wherein the simulated sensor input data is representative of data that can be obtained from the plurality of sensors and is randomly adjusted to represent errors in accuracy of the plurality of sensors and to generate the reduced order model using the values of the predicted parameter using the high-fidelity physics-based model; and
    a component, wherein the controller is configured to control the component based on the active parameter.

8. The system of claim 7, wherein the controller is further configured to perform a test of the component, and wherein the controller indicates a successful test if the active parameter is within a threshold range during the test of the component.

9. The system of claim 7, wherein the active parameter is a characteristic of the aircraft system that cannot be directly sensed by the plurality of sensors.

10. The system of claim 7, wherein the aircraft system is an aircraft air conditioning system, and wherein the component is an air cycle machine.

11. The system of claim 10, wherein the active parameter is a rotational speed of a shaft of the air cycle machine.

* * * * *